(12) United States Patent
Feiweier

(10) Patent No.: US 8,947,085 B2
(45) Date of Patent: Feb. 3, 2015

(54) MAGNETIC RESONANCE METHOD AND APPARATUS TO REDUCE ARTIFACTS IN DIFFUSION-WEIGHTED IMAGING

(75) Inventor: Thorsten Feiweier, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 453 days.

(21) Appl. No.: 13/410,551

(22) Filed: Mar. 2, 2012

(65) Prior Publication Data

US 2013/0063144 A1    Mar. 14, 2013

(30) Foreign Application Priority Data

Mar. 4, 2011   (DE) .......................... 10 2011 005 084

(51) Int. Cl.
*G01R 33/563*   (2006.01)
*G01R 33/565*   (2006.01)
*G01R 33/561*   (2006.01)

(52) U.S. Cl.
CPC .... *G01R 33/56341* (2013.01); *G01R 33/56518* (2013.01); *G01R 33/5616* (2013.01)
USPC ........................................................ 324/309

(58) Field of Classification Search
CPC .......................... G01V 3/56341; G01V 3/4818
USPC ............................ 324/300–322; 600/410–435
See application file for complete search history.

(56) References Cited

U.S. PATENT DOCUMENTS 7,633,291 B2   12/2009 Zwanger
8,436,613 B2 *  5/2013 Feiweier ....................... 324/309
2007/0052417 A1   3/2007 Zhang et al.
2007/0167732 A1   7/2007 Zwanger
2010/0277169 A1  11/2010 Feiweier

OTHER PUBLICATIONS

Reese et al., "Reduction of Eddy-Current-Induced Distortion in Diffusion MRI Using a Twice-Refocused Spin Echo," Magnetic Resonance in Medicine vol. 49 (2003) pp. 177-182.
Stejskal et al., "Spin Diffusion Measurements: Spin Echoes in the Presence of a Time-Dependent Field Gradient," The Journal of Chemical Physics, vol. 42, No. 1 (1965) pp. 288-292.
Heid, "Eddy Current-Nulled Diffusion Weighting," Proc. Intl. Soc. Mag. Reson. Med., vol. 8 (2000) p. 799.
Song, "Categories of Coherence Pathways for the CPMG Sequence," Journ. Magn. Res. vol. 157 (2002) pp. 82-91.
Feiweier, "A Bipolar Diffusion Encoding Scheme with Implicit Spoiling of Undesired Coherence Pathways," Siemens AG 2008.
Clayden et al, "Active Imaging with Dual Spin-Echo Diffusion MRI," Inf. Process. Med. Imaging, Springer Lecture Notes in Computer Science (2009) pp. 264-275.
Vasilic et al, "Coherence-Induced Artifacts in Large-Flip-Angle Steady-State Spin-Echo Imaging," Magn. Reson. Med., vol. 52 (2004) pp. 346-353.

* cited by examiner

*Primary Examiner* — Dixomara Vargas
(74) *Attorney, Agent, or Firm* — Steven H. Noll

(57) ABSTRACT

In a method and system for diffusion-weighted acquisition of MR signals with an image acquisition sequence that has multiple diffusion coding gradients and readout gradients to read out the MR signals, MR signal portions are generated with a desired signal coherence path and MR signal portions are generated with unwanted signal coherence paths, with predominantly the MR signal portions with the desired signal coherence path being acquired by the readout gradients by activating dephasing gradients that reduce the acquisition of MR signal portions with unwanted coherence paths. The dephasing gradients are determined under consideration of the diffusion gradients that are used and under consideration of the unwanted signal coherence paths, so that each has a dephasing gradient moment for each unwanted signal coherence path that is greater than a threshold.

11 Claims, 3 Drawing Sheets

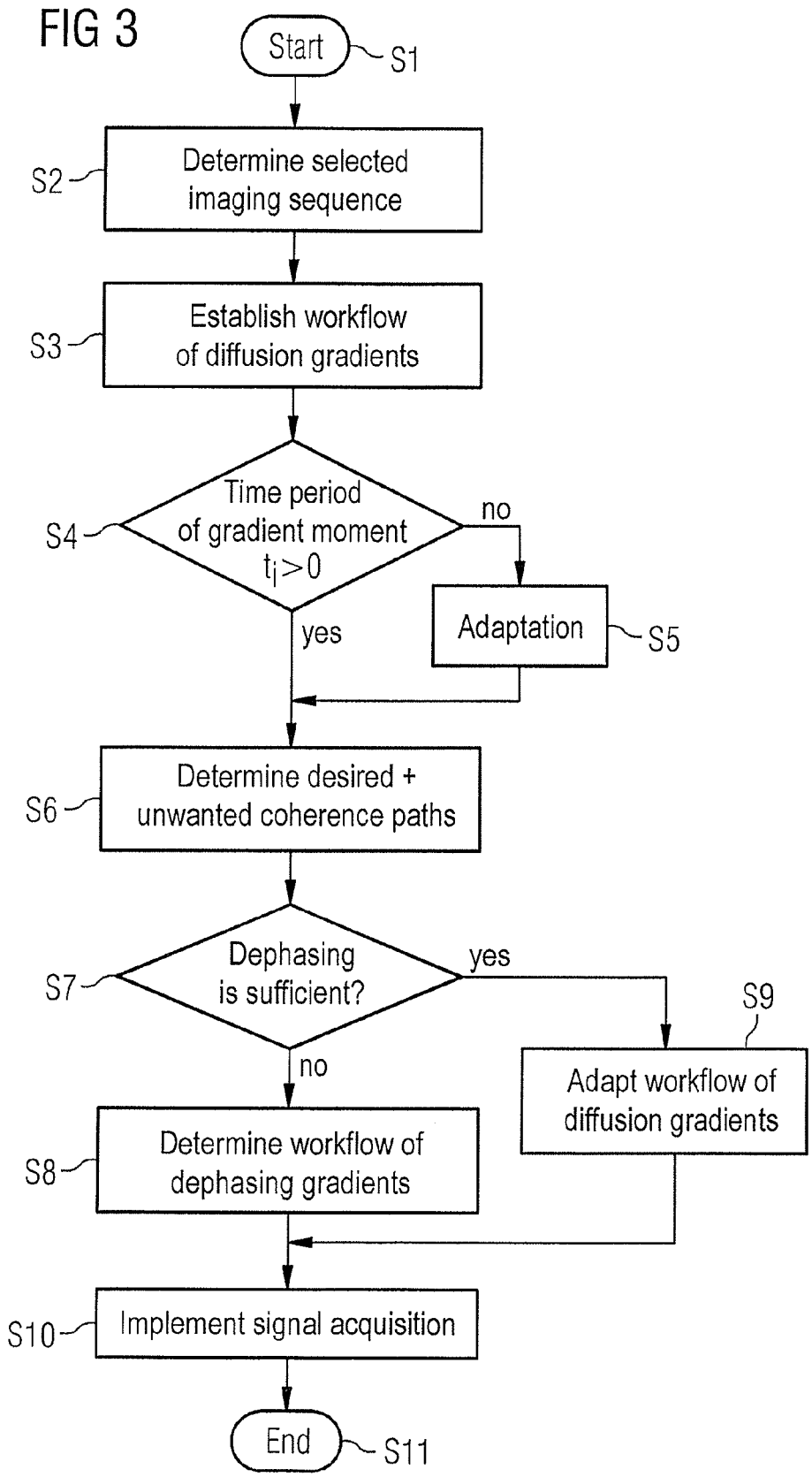

MAGNETIC RESONANCE METHOD AND APPARATUS TO REDUCE ARTIFACTS IN DIFFUSION-WEIGHTED IMAGING

BACKGROUND OF THE INVENTION

1. Field of the Invention

The present invention concerns a method for diffusion-weighted acquisition of magnetic resonance (MR) signals with an image acquisition sequence and an MR system and an electronically readable data storage medium to implement such a method.

2. Description of the Prior Art

In routine clinical practice, diffusion-weighted MR images supply important diagnostic information in stroke and tumor diagnostics. Technically for this purpose, diffusion coding gradients with high amplitude and long duration are combined with a suitable image acquisition module. In order to minimize movement artifacts, a single shot acquisition module is frequently used; echoplanar imaging (EPI) being routinely used. The following parameters are relevant to the quality of the acquired images:

1. signal-to-noise ratio (SNR),
2. geometric deformations,
3. superposition artifacts due to unwanted coherence paths.

In the geometric aspect, static and dynamic deformations occur, both being caused by the high sensitivity of EPI to spatial variations of the basic field amplitude BO. While static deformations are dependent on the basic field magnet and the examination subject (susceptibility), the dynamic deformations (eddy current effects) depend on details of the gradient pulse timing. Particularly when images acquired with different diffusion gradient directions and amplitudes are combined, the dynamic deformations must be kept as small as possible in order to reduce errors in the resulting data (for example anisotropy maps, diffusion maps, tensor data).

Moreover, it must be ensured that only the diffusion-prepared coherence path in the imaging module is acquired. Additionally generated, unwanted coherence paths must be sufficiently strongly suppressed in order to avoid interference artifacts.

Diffusion measurements by means of MR methods have been known for more than 50 years. The most common method for diffusion coding is the monopolar (meaning gradient pulses with only one polarity) spin echo experiment described by Stejskal and Tanner (Journal of Chemical Physics 42 (1965) P. 288-292). This coding scheme has two significant disadvantages:

1. Strong geometric distortions (high proportion of residual exposure fields),
2. Significant loading of the hardware (gradient amplifier (GPA) must provide power for one polarity).

In particular, the strong deformations have motivated the development of a bipolar double spin echo scheme with implicit compensation of eddy current fields (Heid: Proceedings ISMRM 2000, P. 799 and Reese et al.: Magnetic Resonance in Medicine 49: P. 177-182 (2003)). Although the significant disadvantages of the monopolar scheme are eliminated with this, it is at the cost of 1. a longer echo time, and therefore a reduced SNR (approximately 2-5 ms due to the additional RF pulse),
2. interference artifacts due to unwanted signal contributions (FIDs, spin echoes, stimulated echoes) and
3. limited timing parameters due to insolvability of the equations under specific conditions.

The unwanted signal contributions of at least the stimulated echoes can be eliminated by means of suitable dephasing gradients (as described in US 2007/0167732 A1); however 1. the echo time is additionally extended by this (approximately 5-10 ms),
2. interference artifacts due to spin echoes and FIDs remain,
3. the complete elimination of eddy current fields is undermined since the dephasing gradients are not taken into account and
4. the problem remains of the limited parameter range under specific conditions.

By using implicit spoiling, the echo time is reduced, interference artifacts are completely eliminated, and an expanded parameter range is available as described in DE 10 2009 019 895 A1. However, additional compromises must be made in the reduction of eddy current artifacts.

SUMMARY OF THE INVENTION

An object of the present invention is to reduce the eddy current artifacts and to simultaneously eliminate the interference artifacts of all unwanted signal paths in a procedure for diffusion-weighted MR imaging.

According to a first aspect of the invention this object is achieved by for diffusion-weighted acquisition of MR signals with an image acquisition sequence that has a diffusion segment with multiple diffusion coding gradients and a readout segment with readout gradients to read out the MR signals. With the RF pulses of the image acquisition sequence, MR signal portions are generated with a desired signal coherence path and MR signals are generated with unwanted signal coherence paths, and it is predominantly the MR signal portions with the desired signal coherence path that are acquired in the readout segment. In one step according to the method, the MR signal portions of the unwanted signal coherence paths are determined for the image acquisition sequence that is used. Furthermore, dephasing gradients are switched in order to reduce the acquisition of MR signal portions with unwanted coherence paths, wherein the dephasing gradients being determined (configured) under consideration of the diffusion coding gradients that are used and under consideration of the unwanted signal coherence paths, such that the MR signal portions with unwanted signal coherence paths are reduced. The gradient moments of the dephasing gradients for the reduction of the unwanted signal coherence paths are determined such that a dephasing gradient moment for each unwanted signal coherence path is greater than a threshold $M_{spoil}$. The interference artifacts due to unwanted signal coherence paths are eliminated by the inventive method, and it is possible to switch the diffusion coding gradients such that a complete elimination of the eddy current fields is achieved again. The method according to the invention allows an essentially artifact-free acquisition of diffusion-weighted images with increased signal-to-noise ratio and minimal distortions with simultaneously optimal utilization of the gradient system of the MR system. The threshold $M_{spoil}$ can be different for all unwanted signal coherence paths. Likewise, one threshold can also be used for all unwanted signal coherence paths.

One possibility to switch the gradients in the diffusion segment is to use bipolar gradient switches in the diffusion segment. The temporal workflow of the bipolar gradient switches thereby takes place such that the eddy currents induced by the individual gradient moments of the bipolar gradient switch cancel out in the readout window. This means that not only the interference artifacts due to the unwanted signal paths but also the interferences due to the incompletely compensated eddy currents are eliminated.

The temporal workflow of the bipolar gradient switch can be determined such that the times that are necessary for the switching of the additionally switched dephasing gradients are completely accounted for.

One possible image acquisition sequence for the acquisition of the diffusion-weighted MR images is a double spin echo sequence in which two refocusing pulses are activated after an RF excitation pulse. This double spin echo sequence can be advantageously combined with the echoplanar technique.

In the determination of the temporal workflow of the bipolar gradient switch in the diffusion segment, a check can be made to whether the determination of the temporal workflow leads to a solution in which at least one time period for switching of one of the gradient moments of the bipolar gradient switches is negative. In a first possibility, this physically impossible solution for the time period of a gradient moment can be circumvented such that a minimum echo time in which this at least one time period that was previously calculated as negative is positive again (i.e. >0) is calculated automatically for the imaging sequence that is used. This minimum echo time can then be communicated to the user, who is then informed that a smaller echo time than the communicated echo time is not possible.

An additional possibility to compensate for the calculated negative time period is to set this time period to 0 in the determination of the temporal program.

A third possibility is to shorten the duration of the readout segment that is used for the calculation of the time periods. In this embodiment, the refocusing of the signal echo does not take place in the k-space center; rather, the generation of the signal echoes is modified such that the signal echo occurs at an earlier point in time, and therefore the time period for the signal readout can be reduced.

Furthermore, the direction, polarity and/or amplitude of the dephasing gradients can be determined depending on the direction, polarity or amplitude of the diffusion coding gradients. Unwanted signal contributions can be further reduced via this determination of the dephasing gradients depending on the diffusion coding gradients. The possibility exists for the unwanted signal coherence paths are already suppressed below the respective threshold by the suitable switching of the diffusion coding gradients in the image acquisition sequence that is used. This is dependent on the selected imaging sequence, but can occur for several imaging sequences. In this case, no additional dephasing gradients are determined and used.

It is possible that the dephasing gradients are already sufficient in order to suppress the unwanted signal coherence paths. In this case, it is then no longer necessary to switch additional dephasing gradients. According to this embodiment, before the determination of the dephasing gradients it is checked whether the unwanted signal coherence paths are already suppressed below the respective threshold by the switching of the diffusion gradients in the image acquisition sequence that is used, wherein—if this is the case—the determination and switching of the dephasing gradients is omitted. By foregoing the dephasing gradients, the suppression of the residual eddy currents is further improved. The decision of whether dephasing gradients are necessary or not can, for example, be made individually for each gradient axis. For example, if the measurement of the diffusion coding takes place only along the readout direction in an imaging sequence, the dephasing gradient at this axis can possibly be omitted while dephasing gradients are possibly applied on the other two axes, along the slice selection or the phase coding direction.

The invention furthermore concerns a magnetic resonance system with an image acquisition unit to acquire the diffusion-weighted MR signals, and an image sequence controller that determines the dephasing gradients as noted above.

The above object also is achieved in accordance with the present invention by a non-transitory, computer-readable data storage medium that is encoded with programming instructions (code, software) that, when the storage medium is loaded into a control and evaluation computer system of a magnetic resonance apparatus, cause the computerized control and evaluation system to operate the magnetic resonance apparatus to implement any or all of the above-described embodiments of the method according to the invention.

BRIEF DESCRIPTION OF THE DRAWINGS

FIG. 3 is a flowchart of the basic steps to determine the diffusion coding gradients and dephasing gradients according to an embodiment of the present invention.

DESCRIPTION OF THE PREFERRED EMBODIMENTS

Figure 1:
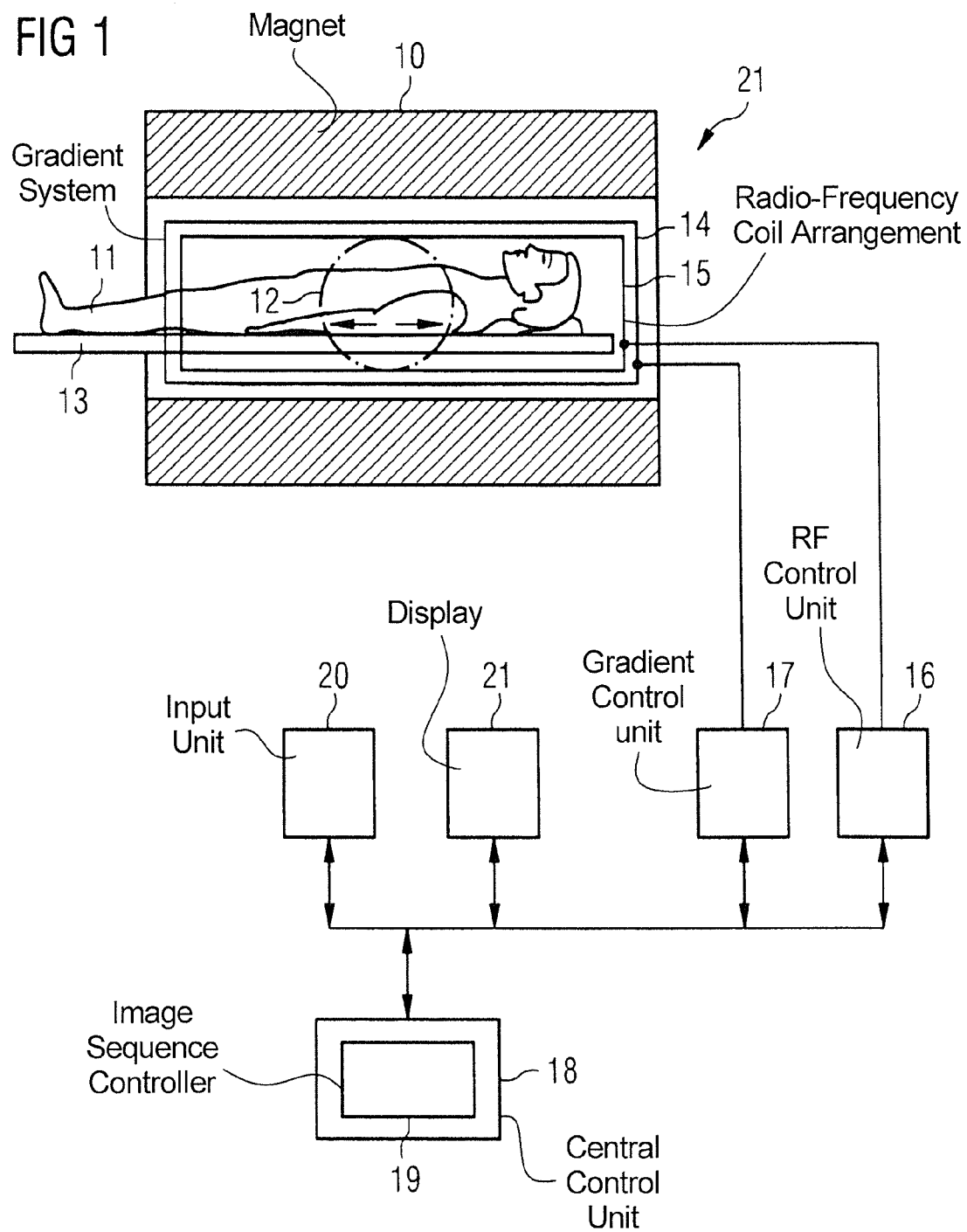
FIG. 1 schematically illustrates an MR system to acquire diffusion-weighted exposures according to the present invention.

FIG. 1 schematically shows a magnetic resonance system is configured to acquire magnetic resonance signals to implement a diffusion-weighted imaging. Such a magnetic resonance system has a magnet 10 to generate a polarization field B0. An examination subject—here a patient 11—is moved into the magnet 10 in order to acquire MR signals of the patient 11 in an examination region 12. The patient 11 lies on a bed table 13. The MR system furthermore has a gradient system 14 to generate magnetic field gradients that are used for the coding in the imaging. In addition to the gradients for spatial coding, the gradient system 14 can generate diffusion coding gradients for the diffusion-weighted MR imaging. To excite the polarization resulting in the basic magnetic field, a radio-frequency coil arrangement 15 is provided that radiates a radio-frequency (RF) field into the examined person in order to deflect the magnetization out of the steady state. For example, excitation pulses (for example 90° pulses or 180° refocusing pulses) can be radiated with the RF coil arrangement. A gradient control unit 17 is provided to control the magnetic field gradients, and an RF control unit 16 is provided to control the radiated RF pulses. The magnetic resonance system is centrally controlled by a central control unit 18 that has an image sequence controller 19 that controls the sequence of the radiated RF pulses and magnetic field gradients depending on the selected image acquisition sequence, and that thus controls the RF control unit 16 and the gradient coil unit 17. Via an input unit 20, an operator can select an image acquisition sequence and enter or modify imaging parameters that are displayed on a display 21. The units 14, 15, 16, 17 can be designed in common as an image acquisition unit. The general functioning of an MR system is known to those skilled in the art and thus need not be described in detail herein.

Figure 2:
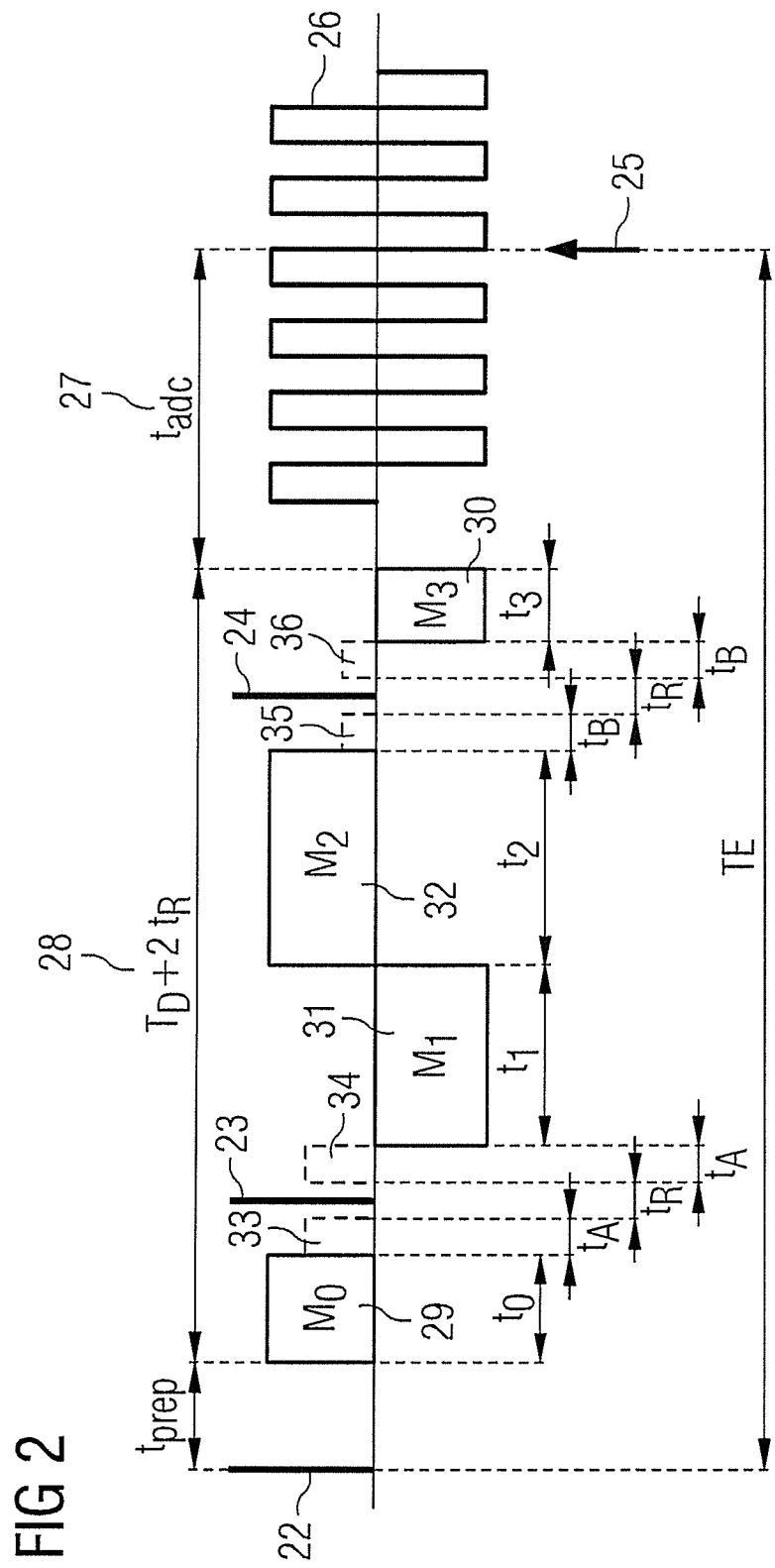
FIG. 2 shows a portion of a sequence designed according to the invention to acquire diffusion-weighted MR signals.

The image sequence controller is designed such that an image acquisition sequence is implemented as it is shown in part in FIG. 2, for example. The temporal workflow of a diffusion-weighted image acquisition sequence (here in particular the diffusion segment and the readout segment) is shown in detail in FIG. 2. After radiation of a 90° excitation pulse 22, a first RF 180° refocusing pulse 23 is radiated, followed by a second RF refocusing pulse 24, such that a signal echo whose maximum occurs at, for example, the point in time shown with the arrow 25 is generated at a point in time TE after radiation of the 90° pulse. The signal acquisition starts with a time period $t_{adc}$ before reaching the signal maximum. As is apparent from the switching of the readout gradient 26, the signal readout takes place with the aid of the echoplanar technique. The gradients that are likewise necessary for slice selection and phase coding are not shown and correspond to the gradient switches that are typically used in such a double spin echo imaging sequence.

The readout segment 27 of the imaging sequence goes beyond the time period $t_{adc}$. After the time period $t_{adc}$, the acquisition of (entry of ray data into) k-space is continued until the required coverage is achieved. The time period $t_{adc}$ represents only a portion of the readout segment. In the EPI technique, the signal readout extends beyond the time period $t_{adc}$; only a portion of k-space is filled during the time period $t_{adc}$. In the ideal case, this is the first half of k-space so that the spin echo coincides directly with the acquisition of the k-space center. However, less than half of k-space can also be acquired, for example with the use of "partial Fourier" techniques or with certain displacement of the spin echo (as mentioned above) in order to enable the equations to be solvable. $t_{adc}$ thus indicates the portion of the readout segment that is used for the calculation of the time periods of the dephasing gradients, as will be explained in more detail later. In addition to the readout segment, a diffusion segment 28 is provided for coding of the diffusion occurring in the examined person 11. In the shown exemplary embodiment, the diffusion segment 28 has a first bipolar gradient pair 29 and 30 with the gradient moment M0 or, respectively, M3, wherein the gradient moment corresponds to the area under the gradient with the time as the ordinate. Furthermore, a second bipolar gradient pair 31, 32 is shown.

In addition to the desired signal coherence path that is read out in the readout segment, additional unwanted signal coherence paths occur due to the radiated RF pulses. Since a 90° excitation pulse does not align all excited nuclear spins by precisely 90° and a 180° refocusing pulse does not rotate all nuclear spins by 180°, each excitation pulse has an excitation component and a refocusing component that then lead to the unwanted signal coherence paths. These unwanted signal coherence paths are reduced by switching additional dephasing gradients. These additional dephasing gradients are switched per pair by the respective 180° pulses, i.e. the dephasing gradients 33, 34 and the dephasing gradients 35 and 36. The attitude, polarity and amplitude of these dephasing gradients are now determined depending on the attitude, amplitude and polarity of the dephasing gradients that are used.

These additional dephasing gradients have the effect of casing the MR signals of the unwanted signal coherence paths to be dephased by the switched gradients, such that the associated MR signal portions are reduced in signal acquisition.

The switching of the additional dephasing gradients thus suppresses the signal coherence paths of the stimulated echoes, spin echoes and FIDs (Free Induction Decays). The per-pair switching at short time intervals minimizes the proportion of the diffusion coding of the dephasing gradients.

If the same gradient strengths are considered, the following conditions must be satisfied:

$$t_0 + = t_2 + t_3 \quad (1)$$

$$t_{prep} + t_0 + t_3 + t_{adc} = t_1 + t_2 \quad (2)$$

Equation (1) indicates that the gradient moments must be the same overall, while Equation (2) describes the temporal workflow of the spin echo refocusing.

In order to minimize the eddy currents induced by the gradient switches at the point in time of the signal readout in k-space, the following equation applies if an exponential signal decay with a single time constant $\tau$ is assumed:

$$\exp(-(2t_A + 2t_B + 2t_R + t_0 + t_1 + t_2 + t_3 + t_{adc})/\tau) + \quad (3)$$
$$-\exp(-(2t_A + 2t_B + 2t_R + t_1 + t_2 + t_3 + t_{adc})/\tau) +$$
$$-\exp(-(2t_B + t_R + t_1 + t_2 + t_3 + t_{adc})/\tau + +$$
$$2\exp(-(2t_B + t_R + t_2 + t_3 + t_{adc})/\tau) +$$
$$-\exp(-(2t_B + t_R + t_3 + t_{adc})/\tau) +$$
$$-\exp(-(t_3 + t_{adc})/\tau) + +\exp(-(t_{adc})/\tau) = 0$$

From FIG. 2 it can furthermore be concluded that $$TE - t_{prep} - t_{adc} - 2(t_A + t_B + t_R) = T_D \quad (4)$$

with the diffusion coding time period $T_D = t_0 + t_1 + t_2 + t_3$ and the refocusing pulse duration $t_r$. As is apparent from Equation (3), the above formulation contains the finite time duration for the application of the dephasing gradients and refocusing RF pulses.

The following variables result direction from the measurement protocol of the imaging sequence that is used:: $t_{prep}$, $t_{adc}$, $t_R$ and the echo time TE. The times for switching of the dephasing gradients $t_A$ and $t_B$ are subsequently considered in further detail, wherein it will result that they can be derived from the necessary dephasing moments, wherein the dephasing moments in turn result from the employed measurement protocol of the image acquisition sequence. This leads to four variables $t_0$, $t_1$, $t_2$, $t_3$ that are determined entirely as described above via the four equations. These are the 4 time periods for switching of the diffusion gradients. It follows from these that:

$$t_1 = -t_0 + T_D/2 \quad (5a)$$

$$t_2 = t_0 + (t_{prep} + t_{adc})/2 \quad (5b)$$

$$t_3 = -t_0 + T_D/2 - (t_{prep} + t_{adc})/2 \quad (5c)$$

wherein $T_D = TE - t_{prep} - t_{adc} - 2(t_A + t_B + t_R)$ applies for the diffusion coding time period. Inserted into Equation (3), this then leads to:

$$\exp(-(TE - t_{prep})/\tau) + -\exp(-(TE - t_0 - t_{prep})/\tau) + \quad (6)$$
$$-\exp(-(TE - t_0 - 2t_A - t_R - t_{prep})/\tau) + +2$$
$$\exp(-(TE/2 - t_A + t_B - t_{prep}/2 + t_{adc}/2)/\tau) +$$
$$-\exp(-(TE/2 - t_0 - t_A + t_B - t_{prep})/\tau) +$$
$$-\exp(-(TE/2 - t_0 - t_A - t_B - t_R - t_{prep})/\tau) + +\exp(-(t_{adc})/\tau) = 0$$

-continued $$\Leftrightarrow \exp(t_0/\tau)(\exp(-(TE-t_{prep})/\tau) + \exp(-(TE-2t_A-t_R-t_{prep})/\tau) + \\ \exp(-(TE/2-t_A+t_B-t_{prep})/\tau) + \\ \exp(-(TE/2-t_A-t_B-t_R-t_{prep})/\tau)) = \\ \exp(-(TE-t_{prep})/\tau) + 2\exp(-(TE/2-t_A+t_B-t_{prep}/2+t_{adc}/2)/\\ \tau) + \exp(-(t_{adc})/\tau)$$

$$\Leftrightarrow t_0 = \tau\ln([\exp(-(TE-t_{prep}-t_{adc})/\tau) + \\ 2\exp(-(TE/2-t_A+t_B-t_{prep}/2-t_{adc}/2)/\tau) + 1]/[ \\ \exp(-(TE-t_{prep}-t_{adc})/\tau) + \\ \exp(-(TE-2t_A-t_R-t_{prep}-t_{adc})/\tau) + \\ \exp(-(TE/2-t_A+t_B-t_{prep}-t_{adc})/\tau) + \\ \exp(-(TE/2-t_A-t_B-t_R-t_{prep}-t_{adc})/\tau)])$$

(7)

It may occur that a valid solution does not exist for all measurement protocols. For example, times $t_0<0$ can occur, which is not a reasonable physical solution. However, it is always possible to calculate a minimal TE with which a value of $t_0>=0$ results; namely, for a large TE Equation (7) is reduced to:

$$t_0 = \tau \ln([\exp(-TE/\tau) + 2\exp(-TE/2\tau) + 1]/[2\exp(-TE/\tau) + \\ 2\exp(-TE/2\tau)]) \geq 0$$

(8).

If the operator has now used an imaging sequence and imaging parameters for which the calculation yields $t_0<0$, a warning can be output to the user, for example, and a parameter range with a minimum echo point in time TE for which a calculation of $t_0>0$ is possible can be indicated. Instead of $t_0$, the time periods $t_1$, $t_2$ or $t_3$ can also be used for calculation.

Another possibility is to set $t_0=0$, which means that the condition of the cancellation of the induced eddy currents is abandoned. In this case, $T_D$ must be $\geq t_{prep}+t_{adc}$ in order to obtain a valid $t_3 \geq 0$.

Another possibility to avoid the use of negative times $t_0$ is to reduce the value of $t_{adc}$) which means that the spin echo condition is no longer satisfied at the point in time of the acquisition of the central k-space line but rather at an earlier point in time. Finally, it is also possible to switch to alternative diffusion coding methods, for example to the method described in DE 10 2009 019 895 A1.

Due to the fact that every RF pulse used in FIG. 2 has excitation and refocusing components, the following new signal coherence paths result, wherein the last signal coherence path is the desired doubly refocused spin echo, while the first eight of the following signal coherence paths form unwanted signal components.

| | | |
|---|---|---|
| 1. FID $\|M_0 + M_A - M_1 + M_A + M_2 + M_B - M_3 + M_B\|$ | $\geq M_{spoil}$ | (8a) |
| 2. FID $\|-M_1 + M_A + M_2 + M_B - M_3 + M_B\|$ | $\geq M_{spoil}$ | (8b) |
| 3. FID $\|-M_3 + M_B\|$ | $\geq M_{spoil}$ | (8c) |

| | | |
|---|---|---|
| 1. SE $\|M_0 + M_A + M_1 - M_A - M_2 - M_B + M_3 - M_B\|$ | $\geq M_{spoil}$ | (8d) |
| 2. SE $\|M_0 + M_A - M_1 + M_A + M_2 + M_B + M_3 - M_B\|$ | $\geq M_{spoil}$ | (8e) |
| 3. SE $\|-M_1 + M_A + M_2 + M_B + M_3 - M_B\|$ | $\geq M_{spoil}$ | (8f) |
| STE $\|M_0 + M_A + M_3 - M_B\|$ | $\geq M_{spoil}$ | (8g) |
| ASTE $\|M_0 + M_A - M_3 + M_B\|$ | $\geq M_{spoil}$ | (8h) |
| DSE $M_0 + M_A + M_1 - M_A - M_2 - M_B - M_3 + M_B$ | $= 0$ | (8i) |

$M_{spoil}$ designates the dephasing gradient moment that is necessary in order to suppress the signal contribution of the appertaining unwanted signal path in the readout interval. The degree of the suppression can be established by the amplitude of $M_{spoil}$. In general, it is ensured that a shift of the unwanted signal trajectory by at least one extent of the acquired k-space region is achieved with the dephasing gradient moment.

Three FID (Free Induction Decay) signals, three spin echo signals, one stimulated echo and one anti-stimulated echo result as unwanted signal coherence paths. The algebraic sign of MA and MB respectively can be positive or negative. These inequalities lead directly to:

| | | |
|---|---|---|
| $\|-(M_1 - M_2) - M_3 + M_A + 2 M_B\|$ | $\geq M_{spoil}$ | (9a) |
| $\|M_3 - M_B\|$ | $\geq M_{spoil}$ | (9b) |
| $\|-(M_1 - M_2) + M_3 + M_A\|$ | $\geq M_{spoil}$ | (9c) |
| $\|-(M_1 - M_2) + 2 M_3 + M_A - M_B\|$ | $\geq M_{spoil}$ | (9d) |
| $\|-(M_1 - M_2) + M_A + M_B\|$ | $\geq M_{spoil}$ | (9e) |

In the event that $|M_3| \geq M_{spoil} + |M_1 - M_2|$ and $|M_1 - M_2| \geq M_{spoil}$ are valid, these inequalities are satisfied with $M_A = M_B = 0$. This means that the diffusion coding gradients generate a sufficient implicit dephasing so that additional dephasing gradients no longer need to be switched. The temporal workflow is completely determined by the protocol; see Equation (5):

$$M_1 = M_0 + G_D T_D / 2 \tag{10a}$$

$$M_2 = M_0 + G_D T_S / 2 \tag{10b}$$

$$M_3 = -M_0 G_D T_D / 2 - G_D T_S / 2 \tag{10c}$$

with the image sequence time $T_S = t_{prep} + t_{adc}$. If this is used in Equation (9), it results as:

| | | | |
|---|---|---|---|
| $\|3 t_0 - T_D + T_S + M_A/G_D + 2 M_B/G_D\|$ | $\geq M_{spoil}$ | $/\|G_D\|$ | (11a) |
| $\|t_0 - T_D/2 + T_S/2 + M_B/G_D\|$ | $\geq M_{spoil}$ | $/\|G_D\|$ | (11b) |
| $\|t_0 + M_A/G_D\|$ | $\geq M_{spoil}$ | $/\|G_D\|$ | (11c) |
| $\|T_D/2 - T_S/2 + M_A/G_D - M_B/G_D\|$ | $\geq M_{spoil}$ | $/\|G_D\|$ | (11d) |
| $\|2 t_0 - T_D/2 + T_S/2 + M_A/G_D + M_B/G_D\|$ | $\geq M_{spoil}$ | $/\|G_D\|$ | (11e). |

Additional explicit dephasing gradients are only necessary in the event that the following applies:

$$|M_0 - G_D T_D /2 + G_D T_S /2| < \tag{12a}$$
$$M_{spoil} + |2M_0 - G_D T_D /2 + G_D T_S /2| \Leftrightarrow$$
$$|t_0 - (T_D - T_S)/2| < M_{spoil}/|G_D| + |2t_0 - (T_D - T_S)/2| \Leftrightarrow$$
$$|G_D| < M_{spoil}/(|t_0 - (T_D - T_S)/2| - |2t_0 - (T_D - T_S)/2|) \Leftrightarrow$$
$$|G_D| < M_{spoil}/(|t_0 + T'| - |2t_0 + T'|) \text{ or}$$

$$|-2M_0 + G_D T_D /2 - G_D T_S /2| < M_{spoil} \Leftrightarrow \tag{12b}$$
$$|2t_0 - (T_D - T_S)/2| < M_{spoil}/|G_D| \Leftrightarrow$$
$$|G_D| < M_{spoil}/|2t_0 - (T_D - T_S)/2| \Leftrightarrow |G_D| < M_{spoil}/|2t_0 + T'|,$$

wherein $T' = (T_S - T_D)/2$. Which condition is more strongly limited here depends on the protocol of the image acquisition sequence that is used. For some image acquisition sequences, for example the switching of the dephasing gradients is always necessary, for example, in the event that $|t_0 + T'| \leq |2 t_0 + T'|$.

If T' is now used in Equation (11), it yields:

| | | | |
|---|---|---|---|
| $\|3 t_0 + 2 T' + M_A/G_D + 2 M_B/G_D\|$ | $\geq M_{spoil}$ | $/\|G_D\|$ | (13a) |
| $\|t_0 + T' + M_B/G_D\|$ | $\geq M_{spoil}$ | $/\|G_D\|$ | (13b) |
| $\|t_0 + M_A/G_D\|$ | $\geq M_{spoil}$ | $/\|G_D\|$ | (13c) |

-continued

| | | |
|---|---|---|
| $\|T' - M_A/G_D + M_B/G_D\|$ | $\geq M_{spoil}/\|G_D\|$ | (13d) |
| $\|2 t_0 + T' + M_A/G_D + M_B/G_D\|$ | $\geq M_{spoil}/\|G_D\|$ | (13e). |

Multiple cases can now be differentiated here.
Case 1: $T' \geq 0$:

$$\Rightarrow 3t_0 + 2T' \geq 0, t_0 + T' \geq 0, t_0 \geq 0, T' \geq 0, 2t_0 + T' \geq 0$$

A special solution is:

$$M_A = \text{sgn}(G_D)M_{spoil} \quad (14a)$$

$$M_B = 2 \text{sgn}(G_D) \quad (14b),$$

wherein sgn designates the sign function that delivers +1 for arguments $\geq 0$ and −1 for arguments $<0$.
Case 2: $0 > T' \geq -t_0$:

$$\Rightarrow 3t_0 + 2T' \geq 0, t_0 + T' \geq 0, t_0 \geq 0, T' < 0, 2t_0 + T' \geq 0$$

A special solution is:

$$M_A = 2 \text{sgn}(G_D)M_{spoil} \quad (15a)$$

$$M_B = \text{sgn}(G_D)M_{spoil} \quad (15b).$$

Case 3: $-t_0 > T' \geq -3/2\, t_0$:

$$\Rightarrow 3t_0 + 2T' \geq 0, t_0 + T' < 0, t_0 \geq 0, T' < 0, 2t_0 + T' \geq 0$$

A special solution is:

$$M_A = 3 \text{sgn}(G_D)M_{spoil} \quad (16a)$$

$$M_B = -2 \text{sgn}(G_c)M_{spoil} \quad (16b).$$

Case 4: $-3/2\, t_0 > T' \geq -2\, t_0$ $$\Rightarrow 3t_0 + 2T' < 0, t_0 + T' < 0, t_0 \geq 0, T' < 0, 2t_0 + T' \geq 0$$

A special solution is:

$$M_A = 3 \text{sgn}(G_D)M_{spoil} \quad (17a)$$

$$M_B = -2 \text{sgn}(G_D)M_{spoil} \quad (17b).$$

Case 5: $T' < -2\, t_0$ $$\Rightarrow 3t_0 + 2T' < 0, t_0 + T' < 0, t_0 \geq 0, T' < 0, 2t_0 + T' < 0$$

A special solution is:

$$M_A = \text{sgn}(G_D)M_{spoil} \quad (18a)$$

$$M_B = -2 \text{sgn}(G_D)M_{spoil} \quad (18b).$$

As the above calculations show, for all possible parameter combinations a valid solution with finite dephasing moments can be determined. The calculated special solutions do not necessarily need to be the best solutions, which means that—depending on the actual selected image acquisition sequence parameters—other solutions could exist given which the explicit use of the dephasing gradients is less urgently necessary.

With the aforementioned special solutions, and under the assumption that a maximum gradient amplitude $G_{spoil}$ is used for the dephasing gradients, a respective upper limit can be determined for the necessary time duration of the switching of the dephasing gradients $t_A$ and $t_B$:

$$t_A < 3M_{spoil}/G_{spoil} \quad (19a)$$

$$t_B < 2M_{spoil}/G_{spoil} \quad (19b).$$

The workflow of Equations (5) and (6) is completely defined, together with the refocusing pulse durations $t_R$ and the measurement protocol.

Shown as examples in the following are two tables with the calculation of the minimum possible echo time TE for different diffusion values b and for a monopolar diffusion coding scheme, a standard bipolar coding scheme and the bipolar diffusion coding scheme according to the invention (called Bipolar SP, for SPoiler-optimized). In the following tables, a spin echo shift is used in order to reduce the echo time for small b-values. The first following table applies for a standard resolution: field of view FOV 230×230 mm, resolution 128× 128 image points, slice thickness 5 mm, spatially optimized direction of the diffusion coding to acquire a trace-weighted image.

| b-value [s/mm²] | monopolar | bipolar | bipolar SP |
|---|---|---|---|
| 0 | 62 ms | 84 ms | 68 ms |
| 500 | 73 ms | 84 ms | 79 ms |
| 1000 | 79 ms | 88 ms | 86 ms |
| 2000 | 88 ms | 97 ms | 96 ms |
| 5000 | 114 ms | 117 ms | 115 ms |
| 10000 | 143 ms | 146 ms | 144 ms |

With improved resolution, the table with the parameters reads:
Field of view FOV 230×230 mm, resolution 192×192 pixels, parallel imaging with acceleration factor 2, slice thickness 5 mm,

| b-value [s/mm²] | monopolar | bipolar | bipolar SP |
|---|---|---|---|
| 0 | 61 ms | 85 ms | 70 ms |
| 500 | 70 ms | 85 ms | 81 ms |
| 1000 | 76 ms | 90 ms | 88 ms |
| 2000 | 85 ms | 100 ms | 98 ms |
| 5000 | 115 ms | 120 ms | 117 ms |
| 10000 | 143 ms | 149 ms | 146 ms |

As is apparent from the above tables, the method according to the invention (bipolar SP) delivers better results than the standard bipolar gradient scheme. The possible echo time is 2-5 ms shorter, which means that the acquisition time is shortened and the signal-to-noise ratio is improved.

Tests with MR acquisitions with different image acquisition sequences have shown that the unwanted signal coherence paths can be effectively suppressed.

With the present invention it is possible to effectively suppress the unwanted signal coherence paths. At the same time, the artifacts due to eddy currents are additionally reduced, wherein the finite time durations of the dephasing gradients and refocusing pulses are taken into account in the time calculation of the diffusion gradients. Furthermore, these dephasing gradients are used only when the dephasing due to the diffusion gradients that are used is not sufficient.

The method according to the invention is summarized in FIG. 3. The method starts in Step S1. In Step S2, the imaging sequence selected by the user is determined with the set imaging parameters. It is subsequently sought to switch the diffusion gradients such that the eddy currents cancel at the point in time of the readout of the k-space center. This step of the establishment of the progression of the diffusion gradients in Step S3 was described above in connection with Equations (1) through (6). In Step S4 it is checked whether one of the time periods for switching the dephasing gradients $t_0$ through $t_3 < 0$. Given the above calculation, this is implemented for $t_0$. If the calculation yields that one of these time periods $<0$, in Step S5 an adaptation can take place as was described above, either [sic] via calculation of an echo time that is so long that the time period for the switching of the gradient moment >0. An additional alternative is to set the associated time period to 0 or to reduce the readout window $t_{adc}$ used for the calculation. These three alternatives can also be arbitrarily combined. In an additional Step S6, the desired and unwanted signal coherence paths are determined as is known from Equations (8). In a further step it is checked whether the dephasing for the individual unwanted signal coherence paths is already so large that the unwanted signal portions are smaller than a respective limit value for the respective signal paths. This is achieved by checking, for each unwanted signal coherence path, whether the achieved dephasing gradient moment is already sufficient (due to the diffusion coding gradients) to suppress the unwanted signal coherence paths in the readout interval. If this is not the case, in Step S8 the determination of the signal readout takes place under consideration of the dephasing gradients, as results from Equations (10) through (19). If the query in Step S7 yields that a switching of additional dephasing gradients is not necessary, in Step S9 the progression of the diffusion gradients must possibly be modified since the time periods for switching of the dephasing gradients was originally taken into account in Step S3. For example, it is possible to merely set the amplitude of the dephasing gradients to zero, wherein the temporal workflow remains unchanged. With the calculations implemented in either Step S8 or S9, the signal acquisition can subsequently be conducted in Step S10 before the method ends in Step S11.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for diffusion-weighted acquisition of magnetic resonance (MR) signals, comprising:

from a computerized control system, operating an MR data acquisition unit with an image acquisition pulse sequence comprising a diffusion segment composed of multiple diffusion coding gradients, at least one RF pulse configured to excite nuclear spins in an examination subject located in the MR data acquisition unit to cause emission of MR signals from the subject, said MR signals comprising MR signal portions generated with a desired signal coherence path and MR signal portions generated with unwanted signal coherence paths, and said image acquisition sequence comprising readout gradients configured to read out said MR signals;

in said computerized control system, determining MR signal portions with said unwanted signal coherence paths dependent on said image acquisition sequence; and from said computerized control unit activating dephasing gradients that reduce, in the MR signals read out by said readout gradients, said MR signal portions with said unwanted signal coherence paths, and determining said dephasing gradients in said computerized control system dependent on said diffusion coding gradients and dependent on said unwanted signal coherence paths by causing a gradient moment, of each of said dephasing gradients, to be greater than a threshold for each of said unwanted signal coherence paths.

2. A method as claimed in claim 1 comprising generating said multiple diffusion coding gradients in said diffusion segment of said image acquisition sequence as multiple bipolar diffusion coding gradients according to a temporal switching sequence that causes eddy currents induced by the respective gradient moments of the multiple bipolar diffusion coding gradients to be cancelled during readout of said MR signals by said readout gradients.

3. A method as claimed in claim 2 comprising determining at least one of a direction, polarity or amplitude of said dephasing gradients dependent on a corresponding at least one of a direction, polarity or amplitude of said diffusion coding gradients.

4. A method as claimed in claim 3 comprising, before determining said dephasing gradients, checking, in said computerized control system, whether the unwanted signal coherence paths are already suppressed below said threshold by activating said diffusion coding gradients in said image acquisition sequence and, if so, omitting determining and activating said dephasing gradients.

5. A method as claimed in claim 2 comprising generating said temporal switching sequence to account for respective times necessary for activating said dephasing gradients.

6. A method as claimed in claim 5 comprising, in said computerized control system, determining whether said temporal switching sequence causes a time period for activating at least one of said gradient moments of said bipolar gradients to be negative and, if so, calculating a minimum echo time for which said time period for activating said at least one of said gradient moments is positive, and using the calculated time period in said temporal switching sequence in said image acquisition sequence.

7. A method as claimed in claim 5 comprising, in said computerized control system, determining whether said temporal switching sequence causes a time period for activating at least one of said gradient moments of said bipolar gradients to be negative and, if so, setting said time period for activating said at least one of said gradient moments of said bipolar gradients to 0 in determining said temporal switching sequence.

8. A method as claimed in claim 5 comprising, in said computerized control system, determining whether said temporal switching sequence causes a time period for activating at least one of said gradient moments of said bipolar gradients to be negative and, if so, shortening a duration of a readout window in which said readout gradients are generated.

9. A method as claimed in claim 1 comprising operating said MR data acquisition unit with a double spin echo sequence comprising an RF excitation pulse and two RF refocusing pulses, as said image acquisition sequence.

10. A magnetic resonance (MR) apparatus for diffusion-weighted acquisition of MR signals, comprising:

an MR data acquisition unit comprising a radio-frequency (RF) system and a gradient system;

a computerized control system configured to operate said MR data acquisition unit with an image acquisition pulse sequence comprising a diffusion segment composed of multiple diffusion coding gradients emitted by said gradient system, at least one RF pulse, emitted by said RF system, configured to excite nuclear spins in an examination subject located in the MR data acquisition unit to cause emission of MR signals from the subject, said MR signals comprising MR signal portions generated with a desired signal coherence path and MR signal portions generated with unwanted signal coherence paths, and said image acquisition sequence comprising readout gradients, emitted by said RF system, configured to read out said MR signals;

said computerized control system being configured to determine MR signal portions with said unwanted signal coherence paths dependent on said image acquisition sequence; and said computerized control unit being configured to operate said gradient system in said MR data acquisition unit to activate dephasing gradients that reduce, in the MR signals read out by said readout gradients, said MR signal portions with said unwanted signal coherence paths, and to determine said dephasing gradients dependent on said diffusion coding gradients and dependent on said unwanted signal coherence paths by causing a gradient moment, of each of said dephasing gradients, to be greater than a threshold for each of said unwanted signal coherence paths.

11. A non-transitory, computer-readable data storage medium encoded with programming instructions, said data storage medium being loaded into a computerized control system of a magnetic resonance (MR) apparatus comprising an MR data acquisition unit, said programming instructions causing said computerized control system to:

operate an MR data acquisition unit with an image acquisition pulse sequence comprising a diffusion segment composed of multiple diffusion coding gradients, at least one RF pulse configured to excite nuclear spins in an examination subject located in the MR data acquisition unit to cause emission of MR signals from the subject, said MR signals comprising MR signal portions generated with a desired signal coherence path and MR signal portions generated with unwanted signal coherence paths, and said image acquisition sequence comprising readout gradients configured to read out said MR signals;

determine MR signal portions with said unwanted signal coherence paths dependent on said image acquisition sequence; and activate dephasing gradients that reduce, in the MR signals read out by said readout gradients, said MR signal portions with said unwanted signal coherence paths, and determine said dephasing gradients in said computerized control system dependent on said diffusion coding gradients and dependent on said unwanted signal coherence paths by causing a gradient moment, of each of said dephasing gradients, to be greater than a threshold for each of said unwanted signal coherence paths.

* * * * *